United States Patent [19]

Hill

[11] 4,389,643

[45] Jun. 21, 1983

[54] MULTIPLEXED PULSE TONE SIGNAL RECEIVING APPARATUS

[75] Inventor: Desmond W. Hill, Brentwood Bay, Canada

[73] Assignee: Edison Control Corporation, Metuchen, N.J.

[21] Appl. No.: 308,498

[22] Filed: Oct. 5, 1981

[51] Int. Cl.[3] .......................... H04Q 9/10; H03K 5/00

[52] U.S. Cl. .......................... 340/825.48; 340/825.71; 307/528

[58] Field of Search ....................... 340/825.48, 825.58, 340/825.71; 324/78 D, 82, 83 Q; 307/510, 511, 516, 518, 526–528; 328/133, 138; 331/1 A; 375/120

[56] References Cited

U.S. PATENT DOCUMENTS

| | | | |
|---|---|---|---|
| 4,021,653 | 5/1977 | Sharp et al. | 340/825.71 |
| 4,057,790 | 11/1977 | Fleming et al. | 340/825.48 |
| 4,071,821 | 1/1978 | Harthill et al. | 324/83 Q |
| 4,181,975 | 1/1980 | Jenkins | 307/518 |
| 4,216,463 | 8/1980 | Backof, Jr. et al. | 340/825.71 |
| 4,309,662 | 1/1982 | Baudoux | 307/528 |
| 4,320,522 | 3/1982 | Hayes | 340/825.71 |

*Primary Examiner*—Donald J. Yusko

*Attorney, Agent, or Firm*—Lewis H. Eslinger

[57] ABSTRACT

A multiplexed pulse tone receiving apparatus for receiving predetermined ones of multiplexed pulse tone signals of the type comprised of pulse tone signals of different tone frequencies, each tone frequency being transmitted during a recurring pulse time slot. The receiving apparatus includes an input gate for supplying all of the multiplexed pulse tone signals to a tone detector. When a particular pulse tone signal having a predetermined frequency is received, gate control circuitry is operative to close the gate and, thereafter, to open the gate periodically only during those time slots in which this same pulse tone signal is received.

12 Claims, 16 Drawing Figures

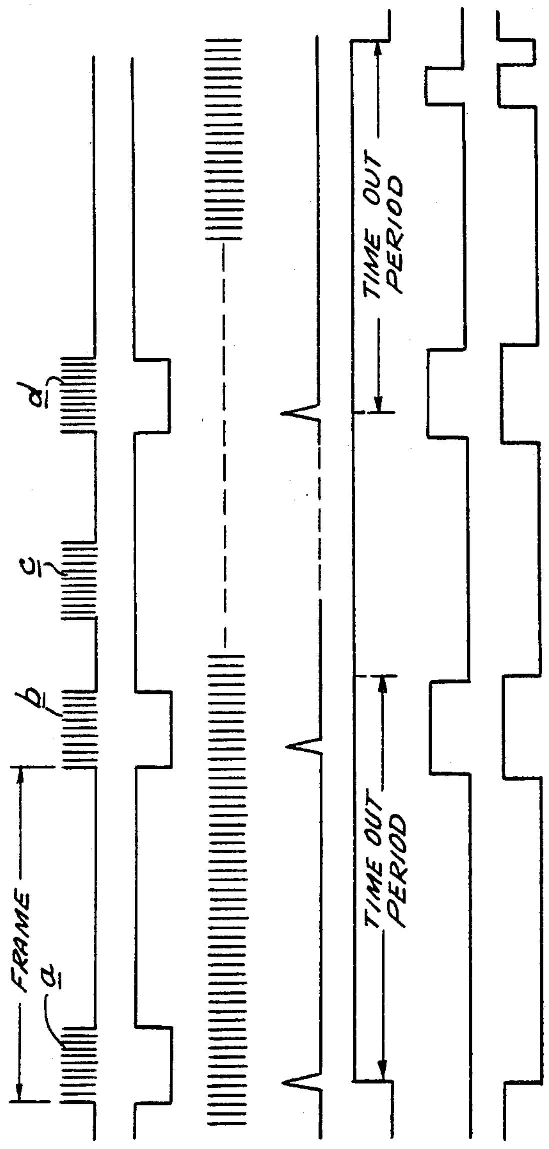
FIG. 2A
FIG. 2B
FIG. 2C
FIG. 2D
FIG. 2E
FIG. 2F
FIG. 2G
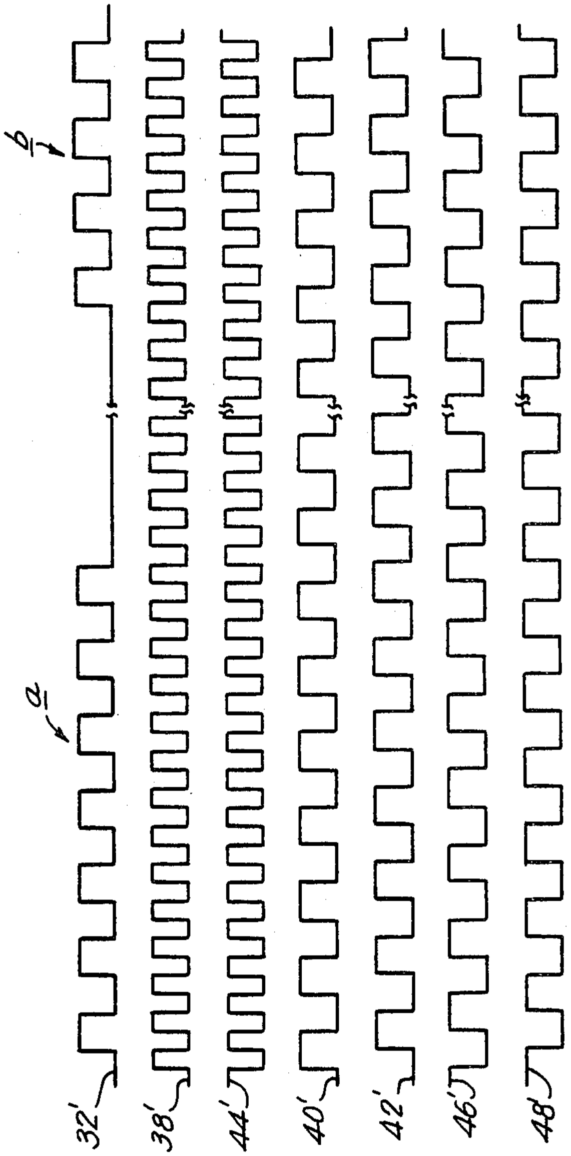
FIG. 3A
FIG. 3B
FIG. 3C
FIG. 3D
FIG. 3E
FIG. 3F
FIG. 3G

MULTIPLEXED PULSE TONE SIGNAL RECEIVING APPARATUS

BACKGROUND OF THE INVENTION

This invention relates to a receiver of the type capable of receiving multiplexed pulse tone signals.

In certain alarm and time-of-event telemeter systems, a short duration signal pulse is transmitted from a remote location to a central receiver. If a number of remote locations are represented by individual tone pulse transmitters having different modulation tones and which are triggered by external means, such as relay or switch contacts, then the position of the transmitter is identified by its unique tone frequency and the time-of-event by the reception of the first pulse signal. The central receiver processes these signals, resulting in an alarm or telemetering system for time-of-event and position signalling.

Because of the random occurrence of the detected events and the plurality of positions required, the signalling pulses should be of short duration compared to their repetition rates, thus allowing a large number of multiplexed time slots.

In this as well as other applications, if tone signals are transmitted as brief, spaced apart burts, that is, if the tone signals are transmitted as pulse tone signals, the power requirements of the transmitter are significantly reduced. However, if the pulse tone signal is relatively narrow, the tone detectors in the central receiver must be capable of responding fast enough so as to detect the presence of corresponding tone signals during the brief, respective intervals that they are present. Furthermore, if the pulse tone signals are transmitted by radiant energy, such as by radio transmitters, rather than via hard-wired systems, the possibility of interference in such radio transmissions requires that the tone detectors exhibit the characteristics of rapidly responding, narrow band filters.

While active filters are known to exhibit desirably narrow pass bands, such active filters generally do not respond with sufficient speed. That is, the inherent time delay of such filters is a disadvantage for use in the aforementioned applications. Digital filter circuits may exhibit favorable response and pass band characteristics; but digital filters generally are relatively expensive to implement.

Furthermore, in applications of the aforementioned type wherein tone signals of different frequencies are to be detected, it is advantageous to provide a filter of basic construction but that is programmable so as to pass different ones of these tone signals as desired. The same unit, or filter, thus can be "programmed" to pass one tone frequency, and as conditions arise or uses change, that same unit can be "re-programmed" to pass a different tone frequency. The aforementioned active filters, unfortunately, are not programmable.

OBJECTS OF THE INVENTION

Therefore, it is an object of the present invention to provide a receiver to receive predetermined ones of multiplexed pulse tone signals, which receiver includes an improved fast response tone detector.

Another object of this invention is to provide a multiplexed pulse tone signal receiver, including a fast-acting, narrow-band tone detector which employs phase detector circuits supplied with respective phases of a frequency-stable reference signal.

An additional object of this invention is to provide a multiplexed pulse tone signal receiver including a tone detector as aforesaid, that is readily adapted to be programmable so as to detect desired ones of various different tone frequencies.

Various other objects, advantages and features of the present invention will become readily apparent from the ensuing detailed description, and the novel features will be particularly pointed out in the appended claims.

SUMMARY OF THE INVENTION

In accordance with one aspect of this invention, a rapid response tone detector is included in apparatus for receiving predetermined ones of multiplexed pulse tone signals. An input signal is supplied to the tone detector by a gate circuit whose operation is controlled, after the initial pulse tone signal of proper frequency is detected, to be opened only at that time slot which passes those pulse tone signals having the proper frequency. In one embodiment, the tone detector is provided with a plurality of phase detectors, each being associated with a respective quadrant and each being supplied with a respective phase of a reference signal having fixed, predetermined frequency, and each phase detector also being supplied with the input signal. Preferably, four phase detectors are provided and are supplied with the 0°, 90°, 180° and 270° phases, respectively, of the reference signal. The phase detection range of each phase detector encompasses the quadrant determined by the phase of the reference signal supplied thereto and, generally, the phase detection range is on the order of about 100°. Advantageously, control over the gate circuit is derived from the same oscillator, preferably a crystal oscillator, that is used to generate the reference signal, thereby assuring proper time synchronization of the apparatus.

BRIEF DESCRIPTION OF THE DRAWINGS

The following detailed description, given by way of example, will best be understood in conjunction with the accompanying drawings in which:

FIGS. 2A–2G are timing diagrams which are useful in understanding the operation of the receiver shown in FIG. 1;

FIGS. 3A–3G are timing diagrams which are useful in understanding the operation of the rapid response tone detector used in the receiver of this invention.

DETAILED DESCRIPTION OF A PREFERRED EMBODIMENT

Figure 1:
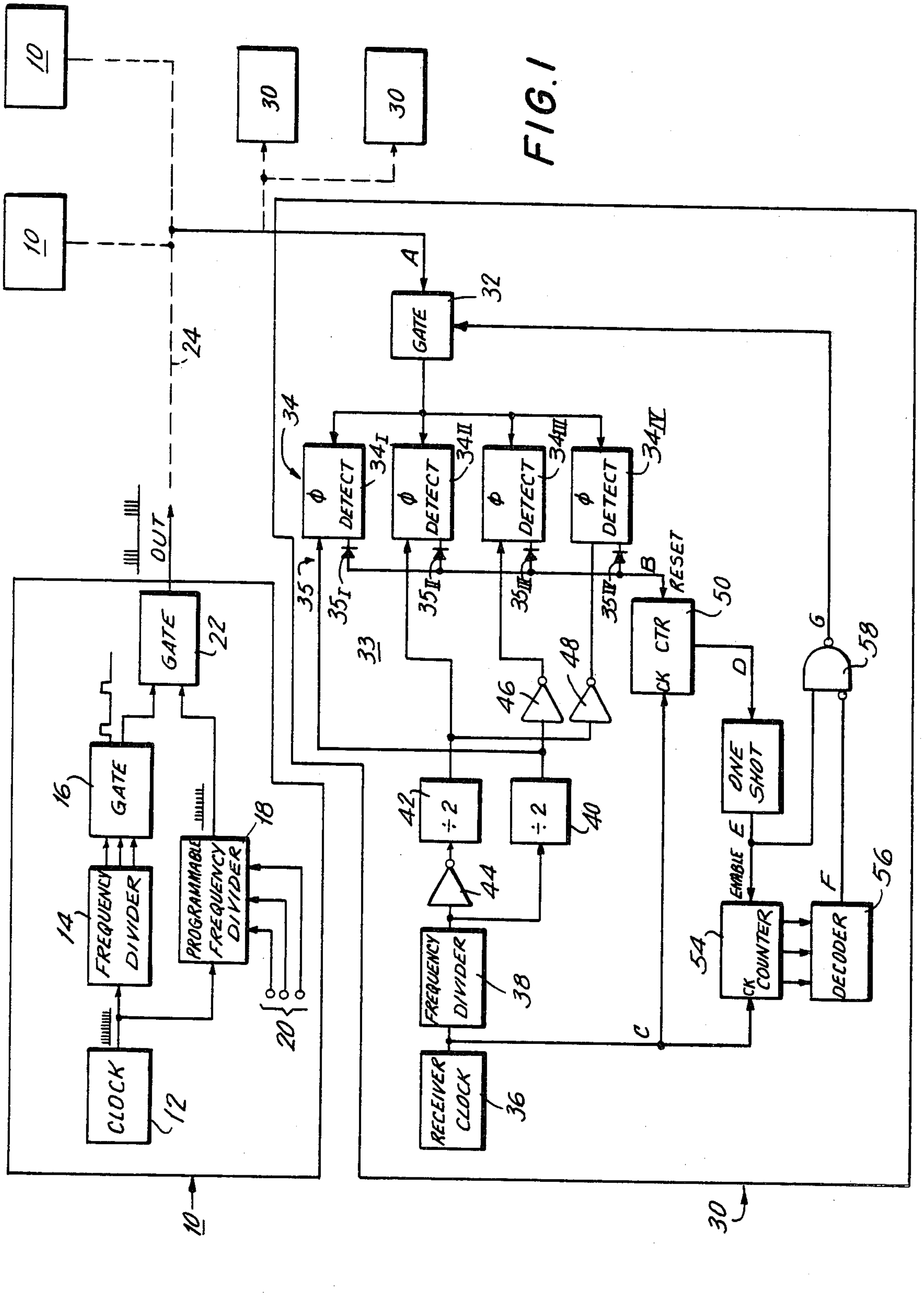
FIG. 1 is a block diagram of a system, including transmitter and the receiver of the present invention.

Referring now to the drawings, and in particular to FIG. 1, there is illustrated a transmission/receiving system in which the receiver of the present invention is used. This system is comprised of a plurality of transmitters 10, only one of which is shown in detail, in communication with a plurality of receivers 30, of which only one is shown in detail. In the illustrated system, each transmitter is adapted to transmit pulse tone signals of a particular frequency. The pulse tone signals are spaced apart and exhibit a relatively low pulse repetition frequency, that is, a pulse repetition frequency which is substantially less than the frequency of the particular tone signal that is transmitted during the pulse interval. The pulse tone signals of all of the transmitters are multiplexed, for example, by time division multiplexing, such that the pulse tone signal transmitted by a particular transmitter 10 is produced periodically during a recurring time slot. For example, if the pulse repetition frequency is equal to one pulse per second, and if the pulse duration is within the range of 5 to 20 msec., thereby exhibiting a very low duty ratio, on the order of 200:1 to 50:1, at least 25 pulse tone signals may be multiplexed during the one second period. That is, a "frame" of multiplexed pulse tone signals may be transmitted at the rate of one frame every second, each frame containing, for example, 25 different pulse tone signals, that is, each pulse tone signal being formed of a "burst" of individual frequency. With 25 multiplexed pulse tone signals, each multiplexing frame may be divided into 25 separate time slots. During successive frames, the pulse tone signal generated by one transmitter will be present during, for example, time slot #1, the pulse tone signal generated by another transmitter will be present during time slot #2, and so on.

These multiplexed pulse tone signals are transmitted to all of receivers 30, such as by radio transmission, hard-wired transmission, or the like. As will be described, each receiver is adapted to detect only the pulse tone signal having a particular frequency associated with that receiver. Once this proper pulse tone signal is detected, the receiver thereafter operates in a timed lock-out mode so as to be inactive during all time slots except the time slot in which the pulse tone signal of proper frequency is present. Thus, randam spurious tone or speech signals occurring between transmissions, even of the same frequency content as said proper frequency, will not cause undesired interference.

One example of transmitter 10 is illustrated as comprising a clock generator 12, a frequency divider 14, a gate circuit 16, a programmable frequency divider 18 and an output gate circuit 22. Clock generator 12, which may include a crystal oscillator, exhibits a highly stable frequency. This clock generator produces clock signals of a relatively high frequency, and is coupled to frequency divider 14 and to programmable frequency divider 18. Frequency divider 14 may comprise a conventional frequency dividing circuit so as to produce a frequency-divided clock signal having the repetition rate of, for example, one pulse per second. It will be appreciated that, if desired, other pulse repetition rates, such as one pulse every two seconds, may be used. Gate circuit 16 is coupled to frequency divider 14 to generate recurring pulses, as illustrated, having the aforementioned pulse repetition rate of one pulse per second (or one pulse every two seconds) with a pulse duration in the range of 5 msec to 10 msec, as desired. Hence, the periodic pulses produced by gate circuit 16 exhibit the aforenoted very low duty ratio.

Programmable frequency divider 18 may be a conventional frequency dividing circuit capable of dividing the frequency of the clock pulses supplied thereto by clock generator 12 by a dividing ratio N. The programmable frequency divider includes a plurality of input terminals 20, adapted to receiving signals representing dividing ratio N. Thus, depending upon these signals, the dividing ratio N may be any practical dividing ratio, as desired. It will be appreciated that, depending upon the selected dividing ratio N, the frequency of the output signal produced by programmable frequency divider 18 will be a corresponding, predetermined frequency. As a numerical example, if clock generator 12 generates a stable clock signal whose frequency is equal to 32.768 KHz, programmable frequency divider 18 will produce an output frequency of 4.096 KHz if dividing ratio N=8, or an output frequency of 2.048 KHz if dividing ratio N=16, or an output frequency of 1.024 KHz if dividing ratio N=32, and so on. It will be appreciated that such frequencies may be readily transmitted during a pulse interval of from 5 msec to 20 msec, that is, during the pulse interval of the pulses produced by gate circuit 16.

Output gate circuit 22 includes a pair of inputs coupled to gate circuit 16 and to programmable frequency divider 18. Output gate circuit 22 may function as an AND gate so as to be enabled in response to each pulse produced by gate circuit 16 to pass the frequency-divided clock signal supplied by the programmable frequency divider. Consequently, output gate circuit 22 produces the illustrated pulse tone signals, each pulse tone signal having a pulse repetition frequency of one pulse every second or every two seconds, each pulse tone signal having a duration in the range of 5 msec to 20 msec, and each pulse tone signal being comprised of a burst of the frequency-divided clock signal as produced by programmable frequency divider 18. Consistent with the aforenoted numerical examples, output gate circuit 22 thus may produce periodic bursts of 4.096 KHz tones, 2.048 KHz tones, 1.024 KHz tones, and the like. It is, of course, appreciated that the particular tone frequency is dependent upon the frequency dividing ratio N established for the programmable frequency divider.

The remaining illustrated transmitters 10 may be of similar construction as that described hereinabove. Of course, different dividing ratios N are selected for such transmitters. Likewise, the clock signal frequency of the clock generators included in such transmitters may differ from the clock signal frequency discussed above with respect to clock generator 12. In one embodiment, the various transmitters may be synchronized so as to prevent the same time slot in each multiplexing frame from being assigned to more than one transmitter. In an alternative embodiment, with the very low duty ratio used herein, if a relatively small number of transmitters is provided, such synchronization might not be necessary. There would be little probability, even in the absence of such synchronism, for two or more transmitters to generate a pulse tone signal during the same time slot. Nevertheless, even if this remote possibility occurs, the fact that the tone frequencies differ from each other minimizes the possibility of interference among such pulse tone signals.

The multiplexed pulse tone signals are transmitted, via communication link 24, to the illustrated receivers 30. In accordance with the present invention, a receiver 30 is comprised of an input gate circuit 32, a tone detector circuit 33, a counter 50, a one-shot pulse generator, or monostable multivibrator 52, a counter 54, a decoder 56 and a gate circuit 58. Input gate circuit 32 is adapted to receive the multiplexed pulse tone signals transmitted thereto via communication link 24. This input gate circuit is actuated by gate circuit 58 in a manner described below.

The output of input gate circuit 32 is coupled to tone detector 33. This tone detector, as will be described, is adapted to detect if the tone frequency of a pulse tone signal supplied thereto is equal to a predetermined frequency associated with this particular receiver 30. The output of tone detector 33 is coupled to counter 50.

Counter 50 is adapted to be reset to an initial count in response to the output signal produced by tone detector 33, and thereafter to count clock signals supplied thereto from a receiver clock generator 36. Preferably, the receiver clock generator includes a crystal oscillator; and this clock generator may be similar to aforedescribed transmitter clock generator 12.

An output of counter 50 is coupled to one-shot monostable multivibrator 52 so as to trigger the one-shot circuit when the counter attains a predetermined count. One-shot circuit 52 is a retriggerable monostable multivibrator having a predetermined time-out period. If a trigger signal is supplied to the one-shot circuit during this time-out period, the one-shot circuit is retriggered so as to reinitiate its time-out period. The output of one-shot circuit 52 is coupled to one input of gate circuit 58 and also to an enable input of counter 54.

Counter 54 also is coupled to receiver clock generator 36 and, when enabled, is adapted to count the clock signals supplied thereto. Counter 54 is a cyclical counter adapted to count from a first count, such as a count of zero, to a maximum count and then, once this maximum count is reached, the counter is reset to zero to resume this counting cycle. Counter 54 includes outputs coupled to a decoder 56 which is adapted to produce an output pulse of predetermined width when counter 54 attains a predetermined count. As one example thereof, decoder 56 may be coupled to selected outputs of counter 54 so as to produce the aforementioned output pulse, which is used as a gating pulse in a manner described below, when the count of counter 54 is within a predetermined range. Hence, since counter 54 is a cyclical counter, it is appreciated that decoder 56 produces periodic gating pulses, each gating pulse being of predetermined width. These gating pulses are supplied to an inverting input of gate circuit 58.

Gate circuit 58 functions as a NAND gate to produce a relatively high output, such as a binary "1" when a relatively low input, such as a binary "0" is supplied thereto from one-shot circuit 52. Gate circuit 58 also is adapted to produce the aforementioned high output in response to each gating pulse supplied to its inverting input from decoder 56, provided that a high input then is received from one-shot circuit 52. Stated otherwise, when one-shot circuit 52 produces a high output, gate circuit 58 is enabled to pass, or transmit, the gating pulses supplied thereto from decoder 56. The high output produced by this gate circuit functions to actuate input gate circuit 32 to assume a transmissive condition so as to pass multiplexed pulse tone signals received from communication link 24 to tone detector 33.

Tone detector 33 is comprised of a plurality of phase detectors 34 and a circuit adapted to generate four quadrature-related phases of a reference signal of predetermined frequency. Phase detectors 34 include phase detectors $\mathbf{34}_I$, $\mathbf{34}_{II}$, $\mathbf{34}_{III}$ and $\mathbf{34}_{IV}$, all of similar construction, such as the phase detectors used in Signetics Model 567 phase locked loop tone decoder, manufactured by Signetics Corporation, Synnyvale, California. The inputs to phase detectors $\mathbf{34}_I$-$\mathbf{34}_{IV}$ are connected in common to the output of input gate circuit 32 and are adapted to receive the multiplexed pulse tone signals transmitted by the gate circuit. Phase detector $\mathbf{34}_I$ includes another input connected to receive the reference signal of 0° phase. Phase detector $\mathbf{34}_{II}$ includes another input connected to receive the reference signal of 90° phase. Phase detector $\mathbf{34}_{III}$ includes another input connected to receive the reference signal of 180° phase. Phase detector $\mathbf{34}_{IV}$ includes another input connected to receive the reference signal of 270° phase. As will be described, the frequencies of these respective phases of the reference signal all are equal. Thus, with respect to this reference frequency, phase detector $\mathbf{34}_I$ may be considered to be associated with the first quadrant of a phase vector of this reference frequency, phase detector $\mathbf{34}_{II}$ may be considered to be associated with the second quadrant of this phase vector, phase detector $\mathbf{34}_{III}$ may be considered to be associated with the third quadrant of this phase vector and phase detector $\mathbf{34}_{IV}$ may be considered to be associated with the fourth quadrant of this phase vector. Each phase detector has a predetermined frequency response range and a predetermined phase detecting range. That is, if the frequency of the tone signal supplied to the phase detector is within this frequency response range, and if the phase of this tone signal is within the phase detecting range, then the phase detector produces an output signal. Beyond these ranges, the phase detector does not produce such an output signal. In particular, if the reference frequency of each of the reference signals supplied to the respective phase detectors is represented as $f_{ref}$, the frequency response range may be expressed as $\Delta f$, wherein $\Delta f$ is the difference between the reference frequency and the frequency of the tone signal which can be detected, and is a function of the impedances, such as the filter capacitors, associated with the phase detectors. It is convenient to express the lock-in frequency range as a function of the reference frequency, such that $\Delta f/f_{ref} \approx \pm 0.5\%$. This means that the pass-band of the phase detector is limited to about ±0.5%, with the center frequency of this pass band equal to the reference frequency $f_{ref}$. It will be appreciated that, if the tone signal frequency is not precisely equal to the reference frequency, but is within the frequency response range, a phase vector representation of the tone signal frequency will appear as a slowly rotating vector.

The phase detecting range of each phase detector preferably encompasses the quadrant with which that phase detector is associated, and is greater than 90°. In one embodiment, this phase detecting range is on the order of about 100°. It is appreciated, therefore, that the phase detecting ranges of phase detectors $\mathbf{34}_I$-$\mathbf{34}_{IV}$ overlap to some degree. For example, if the frequency of the input tone signal supplied to the phase detectors is within the frequency response range, then phase detector $\mathbf{34}_I$ produces an output signal if the relative phase of the tone signal, with respect to the 0° phase of the reference signal, is within the range −5° to +95°. Phase detector $\mathbf{34}_{II}$ produces an output signal if the relative phase of the tone signal is within the range +85° to +185°. Phase detector $\mathbf{34}_{III}$ produces an output signal if the relative phase of the tone signal is within the range +175° to +275°. Phase detector $\mathbf{34}_{IV}$ produces an output signal if the relative phase of the tone signal is within the range +265° to +5°. Of course, if desired, the phase detecting ranges may encompass other portions of adjacent quadrants, for example, the phase detecting range for phase detector $\mathbf{34}_I$ may be from −30° to +70°, from −45° to +55°, and so on.

Each phase detector is adapted to produce an output signal, such as a high level or low level, when supplied with a tone signal with the frequency response and phase detecting ranges thereof. In the illustrated embodiment, this output signal is of relatively low level, such as ground potential. These output signals are coupled, via an OR circuit 35, to the reset input of counter 50. In the illustrated embodiment, OR circuit 35 is comprised of diodes $35_I$, $35_{II}$, $35_{III}$ and $35_{IV}$, coupled to phase detectors $34_I$, $34_{II}$, $34_{III}$ and $34_{IV}$, respectively. It is seen that the anodes of these diodes are connected in common such that, if a low voltage level is applied to the cathode of any one diode, the potential at the common-connected anodes is reduced to, for example, ground potential. If desired, a pull-up resistor (not shown) may be connected to the common-connected anodes to supply a positive potential thereto in the absence of an output signal produced by any phase detector.

The respective phases of the reference signals supplied to phase detectors 34 are produced by the combination of frequency divider 38, inverter 44, frequency dividers 40 and 42 and inverters 46 and 48. Frequency divider 38 is coupled to receiver clock generator 36 and is adapted to divide the frequency by the dividing ratio N/2, where N is the dividing ratio of programmable frequency divider 18. It may be appreciated that, although not shown herein, frequency divider 38 may be a programmable frequency divider similar to programmable frequency divider 18. The output of frequency divider 38 is coupled directly to frequency divider 40 and is coupled, via inverter 44, to frequency divider 42. Each of frequency dividers 40 and 42 is adapted to divide the frequency of the frequency-divided clock signal supplied thereto by a factor of 2. Hence, the combination of frequency divider 38, inverter 44 and each of frequency dividers 40 and 42 functions to divide the frequency of the receiver clock pulses by the dividing ratio N. The output of frequency divider 40 is coupled directly to phase detector $34_I$ to supply the reference signal of 0° phase thereto. The output of frequency divider 42 is connected directly to phase detector $34_{II}$ to supply the 90° phase reference signal thereto. The output of frequency divider 40 is connected, via inverter 46, to phase detector $34_{III}$ to supply the 180° phase reference signal thereto. Finally, the output of frequency divider 42 is connected, via inverter 48, to phase detector $34_{IV}$ to supply the 270° phase reference signal thereto.

The manner in which the receiving apparatus illustrated in FIG. 1 operates now will be described with reference to the timing diagrams illustrated in FIGS. 2A–2G. Let it be assumed that the multiplexed pulse tone signals supplied to input gate circuit 32 via communication link 24 are as shown in FIG. 2A. For purpose of simplification, the duty ratio of the multiplexed pulse tone signals is shown as above that which ordinarily is utilized. In FIG. 2A, it is assumed that pulse tone signals a, b and d are transmitted by the transmitter 10 with which this particular receiver 30 is associated. That is, the frequency of the tone burst included in each of pulse tone signals a, b and d differs from the reference frequency derived at the output of, for example, frequency divider 40, by no more than Δf. It is further assumed that pulse tone signal c, shown in FIG. 2A, is a pulse tone signal transmitted by another transmitter 10 and not intended to be received, or detected, by this particular receiver 30. Hence, the frequency of the burst of tone included in pulse tone signal c is outside the frequency response range of phase detectors 34. Moreover, it is appreciated that pulse tone signals a, b and d are present during the same time slot, such as time slot #1, during each multiplex frame.

Initially, the output signal E of one-shot circuit 52 is at its relatively low level, as shown in FIG. 2E. Consequently, gate circuit 58 produces a gating signal G at a relatively high level, as shown in FIG. 2G, thereby actuating gate circuit 32 to assume its transmissive condition. Consequently, the received multiplexed pulse tone signals, shown in FIG. 2A, are transmitted by gate circuit 32 to phase detectors 34.

It has been assumed that the tone frequency of pulse tone signal a is within the frequency response range of phase detectors 34. The phase of this tone signal thus is within the phase detecting range of at least one of phase detectors $34_I$-$34_{IV}$. Consequently, an output signal B of relatively low level, as shown in FIG. 2B, is produced at the output of OR circuit 35 and supplied to the reset input of counter 50. This counter, which may be reset in response to the leading edge of output signal B, is reset to its initial count, for example, a count of zero, and counter 50 now proceeds to count the receiver clock pulses C, shown in FIG. 2C, and supplied thereto by receiver clock generator 36.

When counter 50 attains a predetermined count, for example, when 256 clock pulses C have been counted (corresponding to a time delay of 256÷32.768 KHz=7.8 msec) an output pulse D, shown in FIG. 2D, is produced by the counter. If desired, counter 50 may be adapted to produce output pulse D when any other desired count is attained. The purpose of this delayed output pulse D is to verify that an output from phase detectors 34 subsists for a minimum period of time, thereby distinguishing, or suppressing, noise, spurious outputs and the like which may be present. This output pulse D triggers one-shot circuit 52 such that the output signal E produced thereby changes over from its relatively low level to the high level in FIG. 2E. This high level, supplied to gate circuit 58, changes over the output signal G from its high, or actuating level, to its low, or inhibiting level, as shown in FIG. 2G.

Output signal E now enables counter 54 to count clock pulses C. Decoder 56 senses when counter 54 attains a first predetermined count, and this first predetermined count is decoded to produce gating pulse F, shown in FIG. 2F. Counter 54 continues to count, and when a second predetermined count is attained, this second predetermined count is detected by decoder 56 so as to terminate gating pulse F. It is appreciated, therefore, that decoder 56 senses when the count of counter 54 is within a predetermined range. Of course, since counter 54 is a cyclical counter, it continues to count, provided the high level enable signal E is supplied thereto, whereby decoder 56 periodically produces gate pulses F as the counter periodically counts through its predetermined range.

It is seen that, when gate pulse F is produced, gate circuit 58 is enabled by the high level E supplied by one-shot circuit 52, whereby the periodic gate pulses F are supplied as actuating pulses to input gate circuit 32. These periodic actuating gate pulses are illustrated in FIG. 2G.

Gate pulses F are produced to coincide with the time slot in which pulse tone signal b is present. Since input gate circuit 32 is opened in response to this gate pulse F, pulse tone signal b is transmitted to phase detectors 34, whereupon the tone frequency of pulse tone signal b is detected in the manner described above. Hence, counter 50 is reset so as to count clock pulses C; and when its predetermined count is reached, the counter triggers one-shot circuit 52 with trigger pulse D.

From FIG. 2E, it is seen that the time-out period of one-shot circuit 52 is greater than the period defined by the pulse repetition frequency of pulse tone signals a, b, d, and so on. Hence, one-shot circuit 52 merely is retriggered by trigger pulse D so as to maintain its high output signal level E. Therefore, counter 54 continues its cyclical counting operation; and decoder 56 detects when the count of this counter is within its predetermined range, as discussed above. Accordingly, gate pulse F is produced to actuate input gate circuit 32 at the time corresponding to the time slot in which pulse tone signal d is received. Thus, pulse signals a, b and d are detected; and the output signal B produced by phase detectors 34 may be utilized, as desired.

FIG. 2A illustrates pulse tone signal c whose frequency differs from the predetermined frequency associated with receiver 30, discussed above, and which is intended to be detected by another receiver. It is seen, from FIG. 2G, that input gate circuit 32 is disabled during the time slot assigned to pulse tone signal c and, thus, this pulse tone signal is not supplied to phase detectors 34.

Let it be assumed that pulse tone signal d is the last pulse tone signal transmitted to the illustrated receiver. Thus, although counter 50 generates trigger pulse D, shown in FIG. 2D, in response to the detection of pulse tone signal d, thereby retriggering one-shot circuit 52, it is seen that this one-shot circuit is not subsequently retriggered prior to the completion of its time-out period. Thus, as shown in FIG. 2E, output signal E produced by one-shot circuit 52 returns to its low level. Hence, gate circuit 58 supplies the high level enabling, or actuating signal to input gate circuit 32, as illustrated in FIG. 2G.

As shown in FIG. 2F, prior to the expiration of the time-out period of one-sshot circuit 52, counter 54 once again counts through the predetermined range sensed by decoder 56. Therefore, while output signal E of one-shot circuit 52 remains at its high level, another gate pulse F, shown in FIG. 2F, is produced and supplied as an actuating pulse to input gate circuit 32 by gate circuit 58. This last gate pulse is generated in response to the detected pulse tone signal d, discussed above.

It will be appreciated that another receiver 30, similar to that discussed above, is provided to detect pulse tone signals c. In such other receiver, the corresponding tone detector is supplied with a reference signal whose frequency corresponds, or is within the frequency response range, of the frequency of the tone signal included in pulse tone signal c. Since the pulse repetition frequency of pulse tone signals c is the same as the pulse repetition frequency of pulse tone signals a, b and d, for example, on the order of about one pulse per second or one pulse every two seconds, such other receiver may include a counter and decoder arrangement, similar to counter 54 and decoder 56, for producing periodic gating signals at the time slots in which pulse tone signals c are present.

Counter 50 is adapted to filter, or inhibit, transients which may be present at the output of phase detectors 34 from erroneously triggering one-shot circuit 52. It is expected that such transient signals will not be present for a time duration sufficient for counter 50 to count a predetermined number (for example, 256) of clock pulses C.

The circuitry comprising receiver 30, illustrated in FIG. 1, may be used to detect pulse tone signals of a different frequency merely by modifying the frequency dividing ratio of frequency divider 38. Advantageously, frequency divider 38 is a programmable frequency divider to facilitate such changes.

In an alternative transmission/reception system, multiplexed pulse tone signals representing data may be preceded by a frame synchronizing pulse tone signal transmitted as the first pulse tone signal in each multiplex frame. The tone frequency of this synchronizing pulse tone signal may be constant from one frame to the next. Such synchronizing pulse tone signal is detected by tone detector 33, whereupon counter 54 is enabled. The predetermined count to which this counter counts, and which is detected by decoder 56, may vary from one receiver to the next such that decoder 56 produces gating pulses F at those time slots in which the pulse tone signals intended for this particular receiver are expected to occur. For example, if pulse tone signals present in time slot #5, that is, the fifth time slot following the synchronizing pulse tone signal in a frame, are to be received by the receiver, decoder 56 detects when counter 54 counts a suitable number of clock pulses so as to produce the gating pulse F coinciding with time slot #5. Alternatively, if the pulse tone signals intended for this receiver are present in time slot #12, decoder 56 detects when counter 54 reaches the appropriate count corresponding to time slot #12. In this manner, input gate circuit 32 is enabled, or actuated, only during the appropriate time slot following the frame synchronizing pulse tone signal. The time-out period of one-shot circuit 52 may be established such that the one-shot output E changes over to its low level immediately prior to the beginning of the next multiplex frame, thereby enabling input gate circuit 32 to pass the synchronizing pulse tone signal. As a further alternative, decoder 56 may be adapted to detect when counter 54 reaches the count associated with the appropriate time slot in a multiplex frame, as well as to detect when counter 54 reaches an initial count corresponding to the time slot in which the synchronizing pulse tone signal is present.

Thus, in this alternative embodiment, the tone frequency of each pulse tone signal may be the same; but discrimination of proper pulse tone signals is based upon time division demultiplexing, whereby input gate circuit 32 is actuated to assume its transmissive condition only during the time slot in which the proper tone pulse signal is present.

In FIG. 2F, it is seen that the duration of gating pulse F is somewhat wider than the duration of each received pulse tone signal. This is preferable, although not mandatory, in order to assure that gate 32 is actuated for a sufficient length of time to allow the received pulse tone signal to pass therethrough to phase detectors 34.

The signals supplied to phase detectors 34 are illustrated in FIGS. 3A–3G. FIG. 3A represents the output signal 32' transmitted by input gate circuit 32. It is appreciated that signal 32' is comprised of, for example, pulse tone signals a and b, discussed previously with respect to FIG. 2A and illustrated on an expanded time axis in FIG. 3A.

FIG. 3B illustrates the frequency-divided receiver clock signal 38' produced by frequency divider 38. Similarly, FIG. 3C illustrates the inverted version 44' of this frequency-divided receiver clock signal, as produced by inverter 44. The frequency-divided receiver clock signal 38' is divided by a factor of 2 by frequency divider 40 resulting in reference signal 40', shown in FIG. 3D. It is assumed, for the purpose of the present discussion, that reference signal 40' exhibits 0° phase. In similar manner, frequency divider 42 divides the phase-inverted, frequency-divided receiver clock signal 44', supplied thereto by inverter 44, by a factor of 2, resulting in reference signal 42', shown in FIG. 3E. Reference signal 42' is shifted by 90° relative to reference signal 40' due to the inversion of the frequency-divided receiver clock signal 38' by inverter 44.

Reference signal 40' is phase-inverted by inverter 46, resulting in reference signal 46', shown in FIG. 3F. This reference signal 46' is phase-shifted by 180° with respect to 0° reference signal 40'. Similarly, reference signal 42' is phase-inverted by inverter 48, resulting in reference signal 48', shown in FIG. 3G. This reference signal 48' is seen to be phase-shifted by 270° with respect to the 0° reference signal 40'.

Reference signals 40', 42', 46' and 48' are supplied to phase detectors $34_I$, $34_{II}$, $34_{III}$ and $34_{IV}$, respectively. In view of the respective phases of these reference signals, phase detector $34_I$ is considered to be associated with quadrant I, that is, with the 0° phase, phase detector $34_{II}$ is considered to be associated with quadrant II, that is, with the reference signal of 90° phase, phase detector $34_{III}$ is considered to be associated with quadrant III, that is, with the reference signal of 180° phase, and phase detector $34_{IV}$ is considered to be associated with quadrant IV, that is, with the reference signal of 270° phase. The received pulse tone signal 32', shown in FIG. 3A, exhibits a phase which substantially coincides with the 90° phase reference signal 42'. Hence, phase detector $34_{II}$ produces the low level output signal (shown in FIG. 2B) in response to received pulse tone signal 32'. It is appreciated that, regardless of the particular phase of this received pulse tone signal, at least one of the phase detectors will produce an output signal in response thereto.

Figure 4:
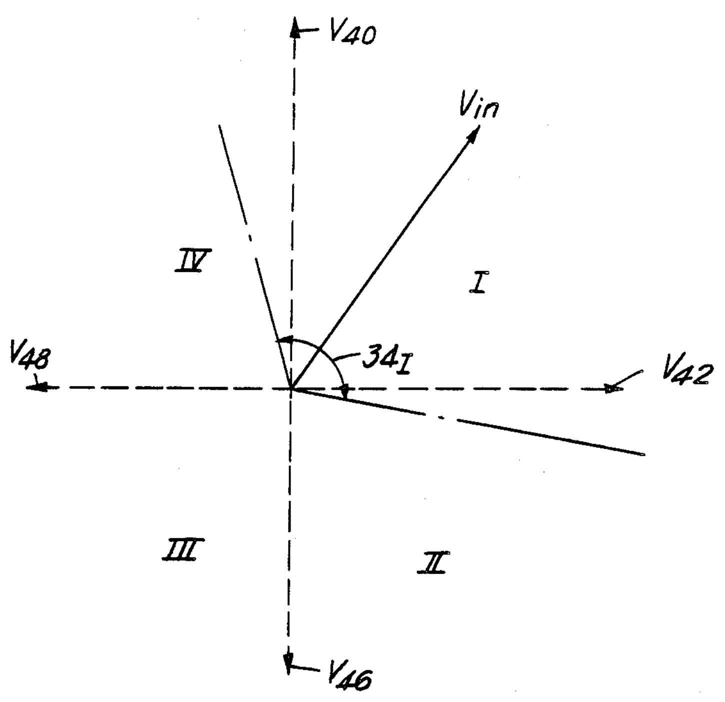
FIG. 4 is a vector diagram which is useful in understanding the operation of the tone detector used in the receiver of this invention.

Let it be assumed that the frequency of the received tone signal is precisely the same as the reference frequency supplied to the phase detector. A phase vector diagram of this condition is illustrated in FIG. 4, wherein the vector $V_{in}$ represents the relative phase of the received tone signal. In FIG. 4 it has been assumed that the phase of the received tone signal is between 0° and 90° and, thus, lies in quadrant I. Hence, in response to this received tone signal, phase detector $34_I$ produces the output signal shown in FIG. 2B.

If the frequency of the received tone signal differs from the reference frequency by a small amount, but well within the frequency response range, vector $V_{in}$ will rotate. Thus, this vector will fall within quadrant I, and then quadrant II, and then quadrant III, and then quadrant IV, with a rate of rotation corresponding to the deviation between the input tone frequency and the reference frequency. As this phase vector rotates through quadrant I, phase detector $34_I$ produces the output signal shown in FIG. 2B. As discussed above, this output signal serves to reset counter 50, thereby enabling the counter to be incremented in response to receiver clock pulses C. If phase vector $V_{in}$ rotates at a sufficiently slow rate, counter 50 will reach its predetermined count so as to produce the trigger signal D, shown in FIG. 2D.

However, if the frequency of the received tone signal is outside the frequency response range of phase detectors 34, then phase vector $V_{in}$ will rotate at a rate such that it passes from quadrant I to quadrant II before counter 50 attains its predetermined count. When the phase vector rotates into the phase detecting range of, for example, phase detector $34_{II}$, that is, when phase vector $V_{in}$ rotates from quadrant I to quadrant II, phase detector $34_{II}$ produces another reset signal to reset counter 50 to its initial count. This resetting of the counter continues before the counter attains its predetermined count. Hence, one-shot circuit 52 is not triggered; and input gate circuit 52 remains open to pass the received pulse tone signals. This operation continues until the pulse tone signal is received with a frequency within the frequency response range of tone detector 33. At that time, the illustrated receiver operates in the manner discussed in detail hereinabove.

While the present invention has been particularly shown and described with reference to a preferred embodiment, it will be readily apparent to those of ordinary skill in the art that various changes and modifications in form and details may be made without departing from the spirit and scope of the invention. For example, the pulse tone signals may represent any desired information. Additional utilizing circuitry (not shown) may be provided so as to be actuated whenever an output signal is produced by phase detectors 34. Alternatively, such utilizing circuitry may function to decode the received pulse tone signals. Each phase detector may be of the type described hereinabove or, alternatively, may be constructed as a conventional switched phase detector known to those of ordinary skill in the art. The combination of frequency divider 38, inverter 44 and frequency dividers 40 and 42 may be replaced by a suitable frequency divider, or counter circuit having particular taps from which reference signals 40' and 42' may be derived.

Still further, the receiver apparatus shown in FIG. 1 may be of the so-called scanning type, adapted to scan various different tone frequencies which may be expected to be transmitted. For example, the scanning receiver may be provided in a monitor system in which plural transmitters transmit continuous tones, such as beacon signals, of respectively different frequencies. The scanning receiver scans each tone frequency to verify that the corresponding transmitter is operating satisfactorily. To achieve such frequency scanning with a single receiver, frequency divider 38 advantageously is programmable, whereby the dividing ratio thereof is stepped so as to vary at a preselected rate. Hence, tone detector circuit 33 is "tuned" from one to another frequency at the same stepping rate as the stepping of this dividing ratio; and the particular frequency to which the tone detector is tuned is determined by the instantaneous dividing ratio of the frequency divider.

It is intended that the appended claims be interpreted as including the foregoing as well as various other such changes and modifications.

What is claimed is:

1. Apparatus for receiving predetermined ones of multiplexed pulse tone signals, comprising:

tone detector means having an input for receiving a tone signal and operable to detect a tone signal of predetermined frequency;

input gate means coupled to said input of said tone detector means for supplying multiplexed pulse tone signals thereto;

output means coupled to said tone detector means for producing an output signal when said tone detector means detects a tone signal of said predetermined frequency; and gate control means responsive to said output signal for periodically actuating said input gate means to assume a transmissive condition so as to pass only predetermined ones of said multiplexed pulse tone signals to said tone detector means.

2. The apparatus of claim 1 wherein said gate control means comprise timing means, energized in response to said output signal, to produce periodic gating signals for actuating said input gate means, said periodic gating signals being time coincident with said predetermined ones of said multiplexed pulse tone signals.

3. The apparatus of claim 2 wherein said timing means comprises a source of clock pulses; cyclical counting means enabled in response to said output signal to count said clock pulses; and means for producing said periodic gating signal when the count of said counting means is within a predetermined range.

4. The apparatus of claim 3 wherein said gate control means further comprises means for actuating said input gate means to assume an initial transmissive condition until said predetermined multiplexed pulse tone signal first is detected and thereafter periodically actuating said input gate means.

5. The apparatus of claim 4 wherein said lastmentioned means comprises retriggerable one-shot pulse generating means having a time-out period greater than the period of said predetermined multiplexed pulse tone signal and triggered in response to said output signal to produce a pulse signal which terminates at the conclusion of said time-out period unless said retriggerable one-shot pulse generating means is triggered during said time-out period; and a gating circuit coupled to said retriggerable one-shot pulse generating means and to said means for producing said gating signal to supply said input gate means with an actuating signal in the absence of said pulse signal or, when said pulse signal is produced, in response to said periodic gating signal.

6. The apparatus of claim 5 wherein said counting means is enabled in response to said pulse signal produced by said retriggerable one-shot pulse generating means.

7. The apparatus of claim 5 further comprising additional counting means enabled by said output signal to count said clock pulses for triggering said retriggerable one-shot pulse generating means when a predetermined count is reached, thereby preventing transient output signals from triggering said one-shot pulse generating means.

8. The apparatus of claim 3 wherein said source of clock pulses comprises a crystal-controlled oscillator.

9. The apparatus of claim 1 wherein said multiplexed pulse tone signals comprise pulse tone signals of different tone frequencies, each tone frequency being present during a predetermined recurring pulse time slot.

10. The apparatus of claim 1 wherein said tone detector means comprises:

reference means for supplying respective phases of a reference signal having fixed, predetermined frequency, each phase being associated with a respective quadrant at said frequency; and a respective phase detector associated with a corresponding one of said quadrants, each said phase detector being coupled to said reference means to receive a respective phase of said reference signal therefrom and each said phase detector being further coupled to said input gate means to receive a multiplexed tone signal therefrom.

11. The apparatus of claim 10 wherein each of said phase detectors is operative to detect that the phase of said supplied multiplexed pulse tone signal is within the quadrant associated therewith if the phase of a predetermined number of cycles of said input tone remains within said quadrant.

12. The apparatus of claim 11 wherein said reference means comprises a source of alternating signal; phase inverting means for inverting the phase of said alternating signal; first and second frequency dividing means for dividing the frequency of said alternating signal and the phase-inverted alternating signal, respectively, by the same predetermined amount; and means for inverting the phases of the frequency-divided signals produced by said first and second frequency dividing means, respectively, whereby the frequency-divided signals and phase-inverted frequency-divided signals constitute four quadrature-related reference signal phases.

* * * * *